(12) United States Patent
Roy

(10) Patent No.: US 7,859,929 B1
(45) Date of Patent: Dec. 28, 2010

(54) SENSE AMPLIFIERS

(75) Inventor: Richard Roy, Dublin, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 98 days.

(21) Appl. No.: 12/422,152

(22) Filed: Apr. 10, 2009

Related U.S. Application Data

(60) Provisional application No. 61/123,805, filed on Apr. 11, 2008.

(51) Int. Cl.
*G11C 7/02* (2006.01)

(52) U.S. Cl. ............... 365/207; 365/205; 365/196; 365/203; 365/189.09; 365/189.11

(58) Field of Classification Search ......... 365/205, 365/207, 196, 154, 189.11, 203, 189.09
See application file for complete search history.

(56) References Cited

U.S. PATENT DOCUMENTS

| | | | |
|---|---|---|---|
| 6,201,418 B1 * | 3/2001 | Allmon | 365/189.05 |
| 6,611,452 B1 | 8/2003 | Han | |
| 6,721,220 B2 | 4/2004 | Yoon | |
| 6,734,815 B1 | 5/2004 | Abdollahi-Alibeik | |
| 6,735,113 B2 | 5/2004 | Yoon | |
| 6,756,838 B1 | 6/2004 | Wu | |
| 6,778,435 B1 | 8/2004 | Han | |
| 6,781,888 B1 | 8/2004 | Horch | |
| 6,785,169 B1 | 8/2004 | Nemati | |
| 6,804,162 B1 | 10/2004 | Eldridge | |
| 6,885,581 B2 | 4/2005 | Nemati | |
| 6,891,774 B1 | 5/2005 | Abdollahi-Alibeik | |
| 6,903,987 B2 | 6/2005 | Yoon | |
| 6,937,085 B1 | 8/2005 | Samaddar | |
| 6,940,772 B1 | 9/2005 | Horch | |
| 6,944,051 B1 | 9/2005 | Lee | |
| 6,947,349 B1 | 9/2005 | Abdollahi-Alibeik | |
| 6,958,931 B1 | 10/2005 | Yoon | |
| 7,054,191 B1 | 5/2006 | Gupta | |
| 7,089,439 B1 | 8/2006 | Abdollahi-Alibeik | |

(Continued)

OTHER PUBLICATIONS

U.S. Appl. No. 11/159,447, entitled "A New Thyristor Based Memory Cell and Architecture," filed Jun. 22, 2005. [Co-pending application; common assignee is T-RAM Semicotuctor, Inc.].

(Continued)

*Primary Examiner*—Thong Q Le
(74) *Attorney, Agent, or Firm*—The Webostad Firm

(57) ABSTRACT

Sense logic, and associated signaling, for dynamic thyristor-based memory cells is described. A first supply voltage level is greater than a second supply voltage level. In an embodiment, cross-coupled inverters of a sense amplifier are operatively coupled between a ground node and the second supply for sensing voltage. The first supply voltage is pass gate coupled to a first sense node and a second sense node. The pass gating is responsive to sample signaling. A first supply transistor is gated by a transfer bus. A second supply transistor is gated by a sense reference voltage that is between the first supply voltage level and the second supply voltage level. Each of the first supply transistor and the second supply transistor is back body biased with a write voltage level that is between the second supply voltage level and the ground voltage level.

20 Claims, 8 Drawing Sheets

U.S. PATENT DOCUMENTS

| | | |
|---|---|---|
| 7,096,144 B1 | 8/2006 | Bateman |
| 7,187,530 B2 | 3/2007 | Salling |
| 7,268,373 B1 | 9/2007 | Gupta |
| 7,304,327 B1 | 12/2007 | Nemati |
| 7,319,622 B1 | 1/2008 | Roy |
| 7,379,381 B1 | 5/2008 | Roy |
| 7,460,395 B1 | 12/2008 | Cho |
| 7,464,282 B1 | 12/2008 | Abdollahi-Alibeik |
| 7,573,077 B1 | 8/2009 | Ershov |
| 2004/0004880 A1 | 1/2004 | Yoon |
| 2004/0022109 A1 | 2/2004 | Yoon |
| 2004/0071013 A1 | 4/2004 | Yoon |
| 2005/0185489 A1 | 8/2005 | Nemati |
| 2006/0139996 A1 | 6/2006 | Nemati |

OTHER PUBLICATIONS

U.S. Appl. No. 11/881,049, entitled "Thyristor Based Memory Cell," filed Jul. 25, 2007. [Co-pending application; common assignee is T-RAM Semiconductor, Inc.].

U.S. Appl. No. 11/881,159, entitled "Thyristor Based Memory Cell," filed Jul. 25, 2007. [Co-pending application; common assignee is T-RAM Semiconductor, Inc.].

U.S. Appl. No. 12/079,548, entitled "Content Addressable Memory Architecture," filed Mar. 27, 2008. [Co-pending application; common assignee is T-Ram Semiconductor, Inc.].

* cited by examiner

SENSE AMPLIFIERS

CROSS-REFERENCE TO RELATED APPLICATIONS

This application claims benefit to U.S. provisional patent application No. 61/123,805, filed Apr. 11, 2008, entitled "Sense Amplifiers" by Richard Roy (an inventor hereof), which is incorporated herein by reference in its entirety. This application is related to the following co-pending United States patent applications: application Ser. No. 11/159,447, entitled "A New Thyristor Based Memory Cell and Architecture," filed Jun. 22, 2005; application Ser. No. 11/881,049, entitled "Thyristor Based Memory Cell," filed Jul. 25, 2007; application Ser. No. 11/881,159, entitled "Thyristor Based Memory Cell," filed Jul. 25, 2007; and application Ser. No. 12/079,548, entitled, "Content Addressable Memory Architecture," filed Mar. 27, 2008. Each of the above-referenced co-pending related patent applications is incorporated herein by reference in its entirety.

FIELD

One or more aspects of the invention generally relate to integrated circuits and, more particularly, to sense logic, and associated signaling, for dynamic thyristor-based memory cells.

BACKGROUND

The performance of logic has increased by orders of magnitude over the past decade. While the performance of memory has increased, such improvement substantially lags the increase in the performance of logic. Memory may be a bottleneck in systems ranging from servers to routers to communications equipment. For example, the Internet revolution dramatically accelerated network performance requirements, but the technological limits of dynamic random access memory ("DRAM") and static random access memory ("SRAM") have created a bottleneck defined by the slow speed of DRAMs and the low density of SRAMs.

System designers have struggled for years to find a solution that successfully matches the density of DRAM with the high speed of SRAM. In recent years, a memory cell based on Negative Differential Resistance ("NDR") was developed as a form of thyristor-based SRAM cell. It generally provides SRAM speeds along with DRAM density. More detailed information about such memory cells can be found in U.S. Pat. Nos. 6,229,161 B1, 6,767,770 B1, and 6,690,039 B1.

However, charge leakage out of such a thyristor-based SRAM cell negatively impacts the restore rate of such cell. Additional details regarding periodically pulsing a thyristor-based SRAM cell to restore state of such a cell may be found in Patent Cooperation Treaty ("PCT") International Publication WO 02/082504. Moreover, an access device associated with such thyristor-based SRAM cell increase the area, namely increase the cell "footprint."

BRIEF SUMMARY

One or more aspects generally relate to sense logic, and associated signaling, for dynamic thyristor-based memory cells.

An aspect is a sense amplifier with a first supply node having associated therewith a first supply voltage level and a second supply node having associated therewith a second supply voltage level. The first supply voltage level is greater than the second supply voltage level. The sense amplifier also has a ground node having associated therewith a ground voltage level. Cross-coupled inverters have a first sense node and a second sense node. The cross-coupled inverters are operatively coupled between the ground node and the second supply node for sensing voltage. A first sampling transistor and a first supply transistor are coupled in series for pass gating between the first supply voltage level and the first sense node. A second sampling transistor and a second supply transistor coupled in series for pass gating between the first supply voltage level and the second sense node. Each of the first sampling transistor and the second sampling transistor are gated by a sample signal. The first supply transistor has a transfer bus coupled to a gate thereof. The second supply transistor is gated by a sense reference voltage that is between the first supply voltage level and the second supply voltage level. Each of the first supply transistor and the second supply transistor is back body biased with a write voltage. The write voltage has a write voltage level that is between the second supply voltage level and the ground voltage level.

Another aspect is a method for voltage sensing. A first supply voltage level and a second supply voltage level are provided, the first supply voltage level being greater than the second supply voltage level. A ground voltage level is provided. Cross-coupled inverters operate between the second supply voltage level and the ground voltage level for the voltage sensing. The first supply voltage level is first pass gated to an input sense node of the cross-coupled inverters. The first supply voltage level is second pass gated to an output sense node of the cross-coupled inverters. The first pass gating and the second pass gating each include asserting a sampling signal for electrical coupling of the first supply voltage level to the input sense node and to the output sense node, respectively. The first pass gating further includes: passing voltage to be sensed on a bus to a first gate for the electrical coupling of the first supply voltage level to the input sense node; applying a write voltage for first back body biasing associated with the first gate; and the write voltage having a write voltage level being between the second supply voltage level and the ground voltage level. The second pass gating further includes: applying a sense reference voltage to a second gate for the electrical coupling of the first supply voltage level to the output sense node; the sense reference voltage having a sense voltage level between the first supply voltage level and the second supply voltage level; and applying the write voltage for second back body biasing associated with the second gate. A first voltage drop from the bus to the input sense node and a second voltage drop from the sense reference voltage to the output sense node are sufficient for the voltage sensing with the cross-coupled inverters operating within a source voltage domain associated with the second voltage level.

Yet another aspect is a sense amplifier with a first supply node having associated therewith a first supply voltage level and a second supply node having associated therewith a second supply voltage level. The first supply voltage level is greater than the second supply voltage level. A ground node has associated therewith a ground voltage level. Cross-coupled inverters have a first sense node and a second sense node. A first sampling transistor and a first pull-up transistor are coupled to the first sense node. A second sampling transistor and a second pull-up transistor are coupled to the second sense node. The first sampling transistor is coupled for pass gating between a transfer bus and the first sense node. The second sampling transistor is coupled for pass gating a sense reference voltage to the second sense node. Each of the first sampling transistor and the second sampling transistor is gated by a sample signal. The first pull-up transistor and the second pull-up transistor are coupled for pass gating the first supply voltage level to the first sense node and the second sense node, respectively. Each of the first pull-up transistor and the second pull-up transistor is gated by a pull-up signal. The cross-coupled inverters are operatively coupled between the first supply node and a write voltage for sensing voltage. An inverter has an input node and an output node. The input node of the inverter is coupled for receiving a sensing activation signal. The output node of the inverter is coupled to a low bias node of the cross-coupled inverters. The inverter is biased between the first supply voltage level and a write voltage level for selectively electrically coupling one of the first supply voltage level and the write voltage level at a time to the low bias node responsive to the sensing activation signal. The sense reference voltage has a sense voltage level between the first supply voltage level and the second supply voltage level. The write voltage level is between the second supply voltage level and the ground voltage level.

Still yet another aspect is another method for voltage sensing. A first supply voltage level and a second supply voltage level are provided, the first supply voltage level being greater than the second supply voltage level. A ground voltage level is provided. Cross-coupled inverters are operated between the first supply voltage level and a write voltage level for the voltage sensing. The write voltage level is between the second supply voltage level and the ground voltage level. Pass gating is implemented with a first sampling transistor between a transfer bus and a first sense node of the cross-coupled inverters and a second sampling transistor a sense reference voltage to a second sense node of the cross-coupled inverters. The sense reference voltage has a sense voltage level between the first supply voltage level and the second supply voltage level. A first sampling transistor and a second sampling transistor are gated with a sample signal. The first supply voltage level is pass gated to the first sense node and the second sense node respectively with a first pull-up transistor and a second pull-up transistor. Each of the first pull-up transistor and the second pull-up transistor are gated with a pull-up signal. A sensing activation signal is inverted for activating and deactivating the cross-coupled inverters for the voltage sensing. The activating and the deactivating include selectively electrically coupling the write voltage level and the first supply voltage level, respectively, to a low bias node of the cross-coupled inverters responsive to the sensing activation signal.

BRIEF DESCRIPTION OF THE DRAWING(S)

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
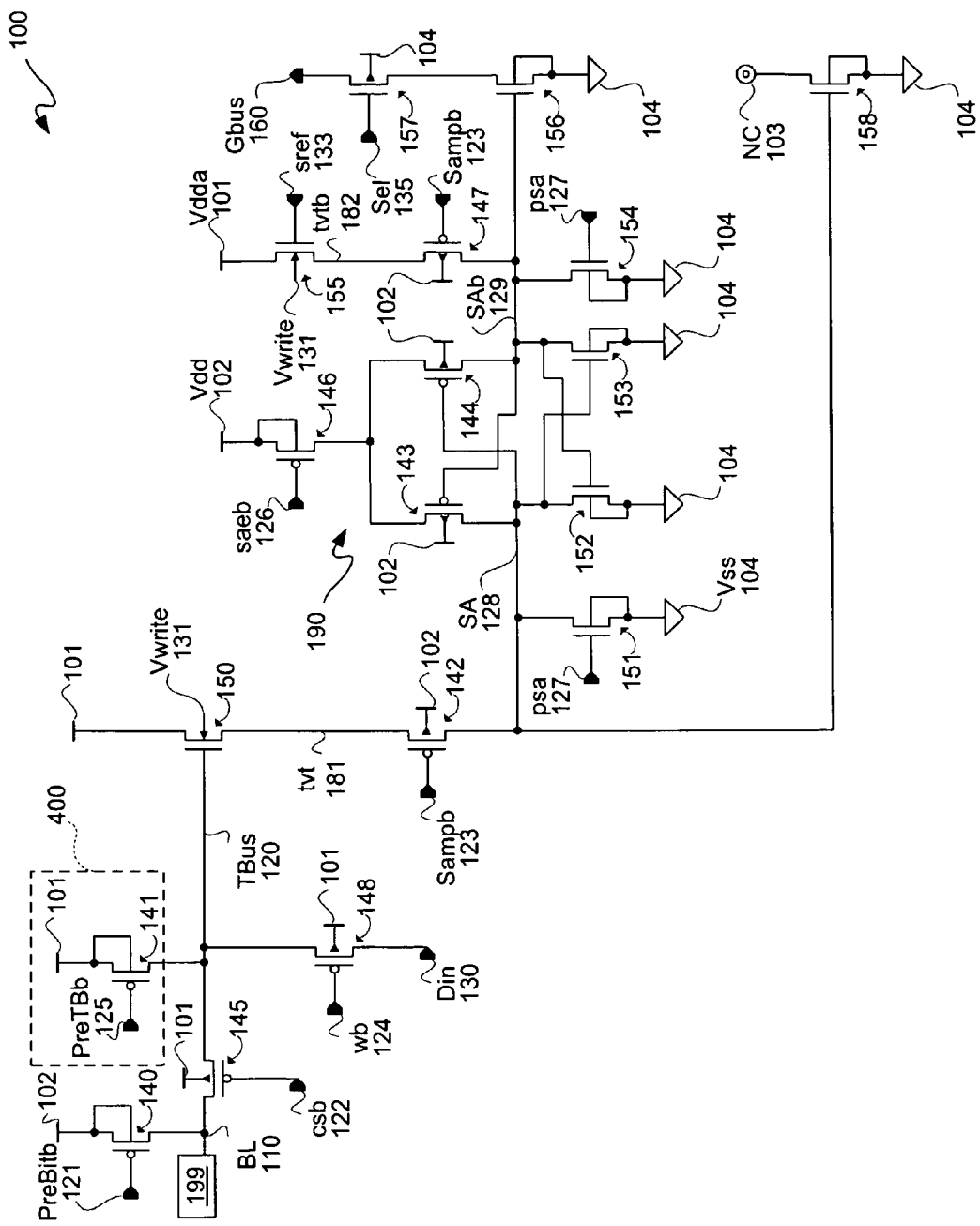
FIG. 1 is a circuit diagram depicting an exemplary embodiment of a sense amplifier ("amp") device.

It should be understood that recently cell area of a thyristor-based memory cell has been significantly reduced. In an embodiment, thinly capacitively coupled thyristor ("TCCT") storage elements are used without having to have associated access devices. In embodiments, such a thyristor-based memory cell may thus consist entirely of a single TCCT storage element, as such cell does not need an access transistor. As a result, the size of the memory cell can be smaller than conventional DRAM cells, as well as smaller than NDR-based SRAM cells. A plurality of these new "dynamic" thyristor-based memory cells may be connected to word, bit, and control lines to form memory arrays. Such memory arrays may be embedded in a host integrated circuit, part of a standalone memory device integrated circuit, or otherwise used. Additional details regarding such "dynamic" thyristor-based memory cells are described in application Ser. No. 11/159,447, entitled "A New Thyristor Based Memory Cell and Architecture," filed Jun. 22, 2005; application Ser. No. 11/881,049, entitled "Thyristor Based Memory Cell," filed Jul. 25, 2007; and application Ser. No. 11/881,159, entitled "Thyristor Based Memory Cell," filed Jul. 25, 2007, each of which is incorporated herein by reference in its entirety.

This new single TCCT storage element memory cell is refreshed along the lines of a one-transistor, one-capacitor ("1T1C") DRAM storage element, and thus may be contrasted with static TCCT storage elements employing an access transistor that are subject to restore pulses. Accordingly, by having to refresh or "pulse-kick" such single TCCT storage element memory cells, they are referred to as "dynamic" thyristor-based memory cells.

A dynamic thyristor-based memory cell is single-ended, namely it does not provide differential outputs like an SRAM storage element. Alternatively, two TCCT storage elements per dynamic thyristor-based memory cell (e.g., for each bit) may be used to provide a differential output as described in additional detail in co-pending application Ser. No. 12/079,548, entitled, "Content Addressable Memory Architecture," filed Mar. 27, 2008, which is incorporated herein by reference in its entirety. The two TCCT storage elements may be used to perform mismatch comparison for both logic 1 and logic 0 states.

Sense amplifiers that may be used with such dynamic thyristor-based memory cells are described below. It should be appreciated that even though the sense amplifiers described below are for single-ended dynamic thyristor-based memory cells, such sense amplifiers, with some minor modifications as will be apparent to one of skill in the art, may be used for differential pairs of such dynamic thyristor-based memory cells.

It should be understood that if a TCCT storage element is in at least a substantially nonconductive state, namely an "OFF" state, for example to represent a logic 0 stored therein, then no current flows through such storage element. Contrastingly, if a TCCT storage element is in at least a substantially conductive state, namely an "ON" state, for example to represent a logic 1 stored therein, then current may flow through such storage element, depending on potential difference between anode and cathode of such storage element. Additionally, it should be appreciated that current only flows in one direction, namely from anode to cathode.

As described in additional detail in co-pending application Ser. No. 12/079,548, entitled, "Content Addressable Memory Architecture," filed Mar. 27, 2008, which is incorporated herein by reference in its entirety, voltage on a supply voltage line may be above both a logic low voltage reference level ("Vss") and a logic high voltage reference level ("Vdd"), and this supply voltage may be used as an anodic voltage for dynamic thyristor-based memory cells. Accordingly, reference to this supply voltage includes its anodic use, and as such it is referred to herein as "Vdda" to clearly distinguish it from Vdd.

For each memory cell array, there may be two separate types of wordlines, generally referred to as wordline 1 ("WL1") and wordline 2 ("WL2"), as described in additional detail in application Ser. No. 11/159,447, entitled "A New Thyristor Based Memory Cell and Architecture," filed Jun. 22, 2005; application Ser. No. 11/881,049, entitled "Thyristor Based Memory Cell," filed Jul. 25, 2007; application Ser. No. 11/881,159, entitled "Thyristor Based Memory Cell," filed Jul. 25, 2007; and application Ser. No. 12/079,548, entitled, "Content Addressable Memory Architecture," filed Mar. 27, 2008, each of which is incorporated herein by reference in its entirety. The exact number of memory cells or bits associated with a WL1 or a WL2 may vary from application to application.

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items, however, in alternative embodiments the items may be different.

Furthermore, for purposes of clarity, a single bitline may be illustratively shown to avoid encumbering the description with multiple lines. Moreover, circuit elements may be referred to or illustratively shown as a single instance thereof, though such reference or illustration may be representing multiples thereof. For example, multiple bitlines and sense amplifiers may be used to provide a memory device, whether standalone or embedded, however for clarity only a single instance may be shown for purposes of clarity and not limitation. Furthermore, though particular voltage levels or other numerical examples are described herein for purposes of clarity by way of example, it should be understood that the scope of the description is not limited to these particular numerical examples as other values may be used. Moreover, even though MOS or polarity types are referenced herein for clarity, it should be understood that in other embodiments an opposite MOS or opposite polarity may be used with respect to the exemplary embodiments described in detail herein.

FIG. 1 is a circuit diagram depicting an exemplary embodiment of a sense amplifier ("amp") device 100. Sense amp device 100 may be used in connection with a dynamic thyristor-based memory cell. In an embodiment, a TCCT storage element may be used to provide a dynamic thyristor-based memory cell ("dynamic TCCT cell"), which is described in additional detail in: application Ser. No. 11/159,447, entitled "A New Thyristor Based Memory Cell and Architecture," filed Jun. 22, 2005; application Ser. No. 11/881,049, entitled "Thyristor Based Memory Cell," filed Jul. 25, 2007; application Ser. No. 11/881,159, entitled "Thyristor Based Memory Cell," filed Jul. 25, 2007; and application Ser. No. 12/079,548, entitled, "Content Addressable Memory Architecture," filed Mar. 27, 2008, each of which is incorporated herein by reference in its entirety.

Bitline ("BL") 110 may be a bitline of an array of dynamic TCCT cells 199. BL 110 may be precharged to Vdd 102 in order to maintain zero volts across TCCT cells 199 coupled thereto during standby. This precharging may be performed by coupling Vdd 102 to BL 110 via p-type transistor 140. Vdda 101 is a higher voltage than Vdd 102. For purposes of clarity by way of example and not limitation, Vdda 101 may be approximately 1.5 volts and Vdd 102 may be approximately 1.0 volts; however, other voltage levels may be used as may vary from application to application.

A source node of p-type transistor 140 may be coupled to Vdd 102, and a drain node of p-type transistor 140 may be coupled to BL 110. A gate of p-type transistor 140 may be coupled to receive precharge bitline bar ("PreBitb") signal 121. P-type transistor 140 may be back biased or body biased by coupling Vdd 102 to a body region associated with such p-type transistor 140.

P-type transistor 145 may be body biased to Vdda 101, and source-to-drain coupled in series between BL 110 and transfer bus ("TBus") 120. By "bus," it is generally meant one or more signals or one or more signal lines or traces or a combination thereof. In other words, p-type transistor 145 is a pass gate for going to and from BL 110 and TBus 120. TBus 120 may be thought of as being on an input side of sense amp device 100 for purposes of a read operation. A gate of p-type transistor 145 is coupled to received column select bar ("csb") signal 122, for selecting a column in an array of dynamic TCCT cells associated with BL 110. The term "bar" indicates negative or complement logic; however, it should be understood that p-type and n-type transistors may be exchanged for one another in some instances and thus negative and positive logic, respectively, may be exchanged for one another, as will be apparent to one of skill in the art. Furthermore, a row select, rather than a column select, may be used.

A drain node of p-type transistor 141 of an optional precharge circuit 400 is coupled to TBus 120, and a source node, as well as a body region, of p-type transistor 141 is coupled to Vdda 101. A gate of p-type transistor 141 is coupled to receive precharge TBus bar ("PreTBb") signal 125. P-type transistor 141 may be implemented with two p-type transistors receiving separate PreTBb signals, namely PreTB1b and PreTB2b, as described below in additional detail with reference to optional pre-charge circuit 400 of FIG. 4.

A drain node of p-type transistor 148 is coupled to TBus 120, and a source node of p-type transistor 148 is coupled to receive data input ("Din") signal 130. Din signal 130 may be held at a Vdd 102 voltage level other than during a portion of a write operation, during which time Din 130 may be raised to a Vdda 101 level. A body region of p-type transistor 148 is coupled to Vdda 101. A gate of p-type transistor 148 is coupled to receive write bar ("wb") signal 124.

If Din signal 130 is asserted for a write operation, wb signal 124 may be asserted for passing data from Din signal 130 to TBus 120. To pass such data to BL 110, csb signal 122 is asserted, and thus a sense amp 190, generally formed by cross-coupled inverters, need not be used for a write operation.

For a read operation, data on BL 110 is to be sensed by sense amp 190 of sense amp device 100. This data or "bit" is passed from BL 110 to TBus 120, as csb signal 122 is asserted during a read operation. As described below in additional detail, TBus 120 for some interval of time is pulled up toward Vdda 101 by assertion of PreTBb signal 125, or two separate PreTBb signals in an alternative embodiment as described with reference to FIG. 4, and wb signal 124 is not asserted. Thus, TBus 120 is electrically decoupled from Din signal 130 during a read operation.

TBus 120 gates n-type transistor 150. A drain node of n-type transistor 150 is coupled to Vdda 101. A body region of n-type transistor 150 is body biased by write voltage ("Vwrite") 131 as associated with a voltage on WL1. Such write voltage is between Vdd and Vss voltage levels. For purposes of clarity by way of example and not limitation, Vwrite 131 may be approximately 0.5 volts; however, other voltages may be used as may vary from application to application. A source node of n-type transistor 150 is coupled to a source node of p-type transistor 142.

P-type transistor 142 is body biased to Vdd 102. A gate of p-type transistor 142 is coupled to receive sample bar ("Sampb") signal 123. Sampb signal 123 is asserted during a read operation to allow a voltage to be sampled by sense amp 190. Sense amp 190 is generally formed by cross-coupled inverters, namely transistors 143 and 152 forming one inverter and transistors 144 and 153 forming the other inverter. Voltage on a sense node or sense signal ("SA") 128 of such sense amp 190 is sourced or sensed from a drain node of p-type transistor 142 for comparison against a sense reference voltage ("sref") 133 provided to sense amplifier 190. A sense reference voltage is between Vdda and Vdd voltage levels.

A gate of n-type transistor 158 may be coupled to SA 128 and thus to a drain node of n-type transistor 142. N-type transistor 158 is a dummy transistor. N-type transistor 158 may be body biased and have its source node coupled to Vss 104. A drain node of n-type transistor 158 is not connected, as indicated by no connect ("NC") 103.

Transistors 150, 142, and 158 respectively mirror transistors 155, 147, and 156. Thus, a dummy transistor, namely n-type transistor 158, is to balance n-type transistor 156.

On an output side of sense amp device 100, n-type transistor 156 is body biased and has its source node coupled to Vss 104. A drain node of n-type transistor 156 may be coupled to a source node of n-type transistor 157. Gating of n-type transistor 156 with sense node or sense signal SAb 129 is described below in additional detail. N-type transistor 157 may be body biased to Vss 104 and have its drain node coupled to a global bus ("Gbus") 160. Select output ("Sel") signal 135 gating transistor 157 may be asserted to select the output on a sense node of sense amp 190, namely sense node SAb 129.

Prior to a sensing operation, sense amp 190 may have sense node SA 128 and opposite sense node SAb 129 each coupled to Vss 104 respectively by n-type transistors 151 and 154. Each of n-type transistors 151 and 154 may be body biased and have its respective source node coupled to Vss 104, and each of such transistors 151 and 154 may have its respective gate coupled to receive pulldown sense amp ("psa") signal 127.

However, once sense amp 190 is activated, psa signal 127 is not asserted and sense amp enable bar ("saeb") signal 126 is asserted. P-type transistor 146 has its source and body regions coupled to Vdd 102, and a gate of p-type transistor 146 is coupled to receive saeb signal 126. A drain of p-type transistor 146 is coupled to source nodes of p-type transistors 143 and 144. Each of p-type transistors 143 and 144 is body biased to Vdd 102. A drain node of p-type transistor 143 and a gate of p-type transistor 144 are coupled to SA 128. A gate of p-type transistor 143 and a drain node of p-type transistor 144 are coupled to SAb 129.

Each of n-type transistors 152 and 153 has its respective source node coupled to Vss 104 and each is body biased to Vss 104. A drain node of n-type transistor 152 and a gate of n-type transistor 153 are coupled to SA 128. A gate of n-type transistor 152 and a drain node of n-type transistor 153 are coupled to SAb 129. As operation of cross-coupled inverters of sense amp 190 is well-known, such operation is not described in unnecessary detail herein for purposes of clarity.

During a sensing operation, p-type transistor 146 is in at least a substantially conductive state ("ON"), and thus sense amp 190 senses using Vdd and Vss logic levels. Vwrite 131 is used to back bias n-type transistor 155, which is sourced at a Vdda 101 level. Sref 133 is provided to a gate of n-type transistor 155. A drain node of n-type transistor 155 is in series with a source node of p-type transistor 147, and transistor 147 is gated with sampb 123.

Transistors 150 and 155 are both source and body biased by Vdda 101. Transistor 155 is gated by sref 133, and voltage on TBus 120 is used to gate transistor 150. Transistors 150 and 155 are in a Vdda 101 voltage domain in contrast with sense amp 190 which is in a Vdd 102 voltage domain. To address the voltage difference between Vdd 102 and Vdda 101, for Vdda 101 being substantially greater than Vdd 102, n-type transistors 150 and 155 may be "high threshold voltage transistors." By "high threshold voltage transistors," it is generally meant transistors having a sufficiently high threshold voltage for purposes of compensating for going from a higher source voltage domain to a lower source voltage domain, such as from a Vdda voltage domain to a Vdd voltage domain. Thus, voltage drop from TBus 120 to SA 128, and likewise voltage drop from sref 133 to SAb 129, is sufficient for operating within a Vdd 102 source voltage domain.

For purposes of clarity by way of example and not limitation, example voltage values are used. However, it shall be appreciated from the following description that these or other voltage values may be used. For a logic 0 appearing on BL 110, a Vdda voltage level of approximately 1.5 volts may correspondingly be on TBus 120. For a logic 1 appearing on BL 110, a voltage closer to Vdd, such as a voltage of approximately 1.1 volts, may appear on TBus 120. Again, for purposes of clarity by way of example and not limitation, it shall be assumed that the threshold voltage of transistors 150 and 155 is approximately 0.4 volts. Furthermore, for purposes of clarity by way of example and not limitation, it shall be assumed that the drain-to-source voltage drop associated with p-type transistors 142 and 147 is negligible. Accordingly, for sref 133 of approximately 1.3 volts, a reference voltage on SAb 129 may be approximately 0.9 volts. A logic 1 on BL 110 and a threshold voltage drop due to n-type transistor 150 means that SA 128 may be approximately 0.7 volts. If, however, a logic 0 were on BL 110, then TBus 120 would be at approximately 1.5 volts, and hence SA 128 may be approximately 1.1 volts after the threshold voltage drop associated with n-type transistor 150.

For a logic 0 input to sense amp 190, approximately 1.1 volts may be on SA 128 and thus causes n-type transistor 153 to turn ON. N-type transistor 152 having approximately 0.9 volts on SAb 129 applied to its gate thus does not turn ON. Turning ON transistor 153 causes Vss 104 to be electrically coupled to the gate of p-type transistor 143 causing such p-type transistor to turn ON, and thus p-type transistor 144 does not turn ON. P-type transistor 143 thus electrically couples SA 128 to Vdd 102 in order to hold such sense node at a Vdd voltage level. Accordingly, sense amp 190 by sensing a logic 0 at SA 128 pulls SAb 129 down to Vss 104.

For a logic 1 input to sense amp 190, SA 128 may be at approximately 0.7 volts in comparison to approximately 0.9 volts on SAb 129. Hence, n-type transistor 152 turns ON before n-type transistor 153, which means n-type transistor 153 does not turn ON. Turning ON n-type transistor 153 means that SA 128 is pulled to Vss 104, and thus p-type transistor 144 turns ON preventing p-type transistor 143 from turning ON. Thus, SAb 129 may be electrically coupled to Vdd 102 through p-type transistor 144, and thus a logic 1 may be sensed on SAb 129 by sense amp 190. Generally, Vss 104 and Vdd 102 levels are used for logic 0 and logic 1 levels, respectively, with reference to sense amp 190.

An output logic level on SAb 129 is used to gate n-type transistor 156. Hence, a logic 0 may be provided to a source node of transistor 157 responsive to a logic 1 on SAb 129 for providing information to Gbus 160 as to the inverse state of a memory cell bit output on BL 110. Furthermore, if output node SAb 129 is at a logic 0 level, n-type transistor 156 is substantially non-conductive ("OFF"), and this state may be indicated on Gbus 160 by an absence of a change of state.

It should be understood that p-type transistors 140 through 148 and n-type transistors 150 through 158 may all be thin gate dielectric devices, such as "thin" oxide devices. By "thin," it is generally meant gate dielectrics substantially susceptible to degradation if operated with greater than an approximately 1-volt swing. Furthermore, it should be appreciated that all of such transistors of sense amp device 100 of FIG. 1 may experience no more than a Vss to Vdd difference in voltage, where a Vwrite to Vdda voltage difference is at least approximately equivalent to a Vss to Vdd voltage difference. By limiting the amount of voltage differential experienced by thin oxide transistors, the likelihood of degrading or damaging such thin oxide devices is substantially reduced. In particular, a source voltage and a threshold voltage associated with n-type transistors may be selected such that voltage at thin gate dielectric threshold voltage transistor ("tvt") node 181 between n-type transistor 150 and p-type transistor 142 is not above Vdd for any extended length of time to enhance reliability. Thus, even though the example of approximately 1.1 volts is used, a voltage of approximately 1.0 volts (e.g., approximately Vdd) or less may be used. Furthermore, a complement node to node 181, namely "tvtb" node 182, may generally be held a constant voltage below Vdd to enhance reliability, which in the above example is approximately 0.9 volts, but may be lower, such as approximately 0.85 volts or less.

Figure 2:
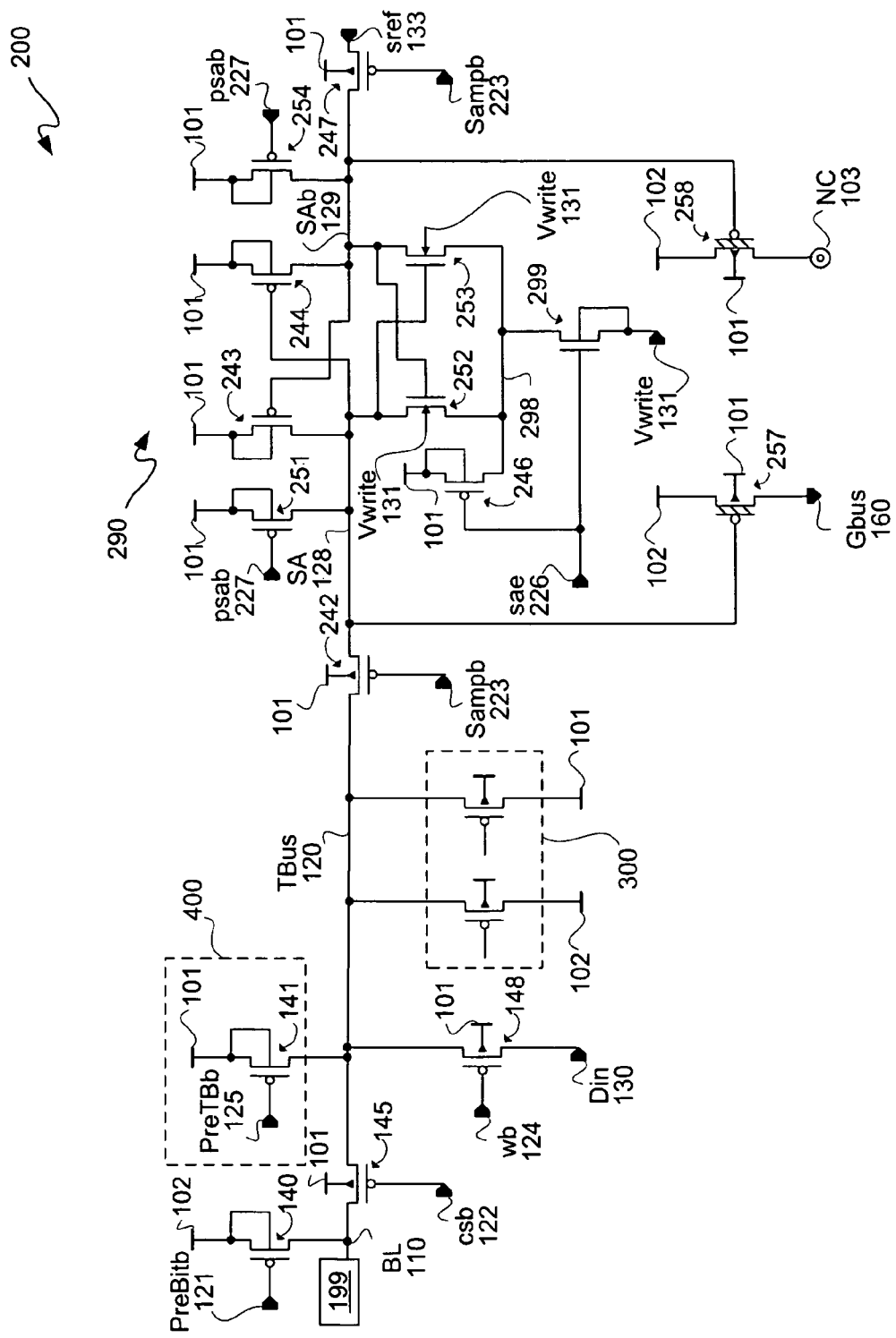
FIG. 2 is a circuit diagram depicting another exemplary embodiment of a sense amp device.

FIG. 2 is a circuit diagram depicting an exemplary embodiment of a sense amp device 200. Sense amp 290 of sense amp device 200 may operate in a Vdda 101 source voltage domain in contrast to sense amp 190 of FIG. 1. Transistors 140, 141, 145, and 148, as well as associated signals are the same in sense amp device 200 as in sense amp device 100 of FIG. 1. As operation of transistors 140, 141, 145, and 148, and associated signals, has been described previously with reference to FIG. 1, such description is not repeated. Furthermore, optional sensed-level hold circuit 300 is described below in additional detail with reference to FIG. 3.

TBus 120 is coupled to a source node of p-type transistor 242 which transistor is body biased to Vdda 101. A gate of p-type transistor 242 is coupled to receive Sampb signal 223. Sampb signal 223 operates at Vdda 101 and Vwrite 131 voltages levels, in contrast to Sampb signal 123 of FIG. 1 which operates at Vdd 102 and Vss 104 voltage levels. Moreover, SA 128 and SAb 129 are operated at Vdda 101 and Vwrite 131 voltages levels, in contrast to SA 128 and SAb 129 of FIG. 1 which are operated at Vdd 102 and Vss 104 voltage levels.

A drain node of p-type transistor 242 is coupled to SA 128 of a sense amp 290, generally formed by transistors 243, 244, 252, and 253. In this embodiment, SA 128 is used as both an input and an output sense node, as Gbus 160 is coupled to such node via p-type transistor 257.

P-type transistor 257 is body biased to Vdda 101 but sourced from Vdd 102. A gate of p-type transistor 257 is coupled to input node SA 128. P-type transistor 258 is a dummy transistor to balance with p-type transistor 257. P-type transistor 258, like p-type transistor 257, has its source coupled to Vdd 102 and is body biased by Vdda 101. However, a drain node of p-type transistor 258 is not coupled, as generally indicated by NC 103.

Mirroring p-type transistor 242 is p-type transistor 247. P-type transistor 247 has its gate coupled to receive Sampb signal 223 and a source node coupled to receive sref 133. P-type transistor 247 is body biased to Vdda 101. A drain node of p-type transistor 247 is coupled to SAb 129 and to a gate of p-type transistor 258. A drain node of p-type transistor 242 is coupled to a gate of p-type transistor 257.

Applied to respective gates of p-type transistors 251 and 254 is psa bar ("psab") signal 227. P-type transistors 251 and 254 are both sourced from and body biased by Vdda 101. A drain node of p-type transistor 251 is coupled to SA 128, and a drain node of p-type transistor 254 is coupled to SAb 129. Provided to respective gates of p-type transistor 246 and n-type transistor 299 is sae signal 226. Transistors 246 and 299 in combination provide an inverter having an input node for receiving sae signal 226 and an output node coupled to a logic low bias node 298 of cross-coupled inverter transistors 252 and 253. Prior to operation of sense amp 290 for sensing, psab signal 227 is asserted and sae 226 is not asserted. Accordingly, SA 128 and SAb 129 are pulled up respectively by p-type transistors 251 and 254 generally to Vdda 101.

P-type transistor 246 has its source node and body region coupled to Vdda 101 and is ON when sae signal 226 is not asserted. A drain node of p-type transistor 246 is coupled to source nodes of n-type transistors 252 and 253. Transistors 243 and 252 form one inverter of the cross-coupled inverters of sense amp 290, and transistors 244 and 253 form the other inverter of the cross-coupled inverters of sense amp 290. Transistors 244 and 253 have their gates coupled to SA 128, and transistors 243 and 252 have their gates couple to SAb 129. Source nodes of p-type transistors 243 and 244, as well as respective body regions thereof, are coupled to Vdda 101. Body regions of n-type transistors 252 and 253 are coupled to Vwrite voltage 131. Source nodes of n-type transistors 252 and 253 are coupled to a drain node of n-type transistor 299. A drain node of transistor 252 is coupled to SA 128, and a drain node of transistor 253 is coupled to SAb 129. A body region and a source node of n-type transistor 299 is coupled to Vwrite voltage 131. Again, sae signal 226 is used to gate n-type transistor 299. N-type transistor 299 is OFF when sense amp 290 is not in a sense mode.

For a read operation, using the same voltage levels as previously described, TBus 120 may have approximately 1.1 volts for a logic 1 bit on BL 110 and may have approximately 1.5 volts for a logic 0 on BL 110. Again, sref 133 is approximately 1.3 volts. However, sense amp device 200 is not as dependent upon threshold voltages matching as sense amp device 100 with respect to n-type transistors 150 and 155. This is because rather than having voltages applied from respective gates of transistors to sense nodes as is shown with respect to sense amp device 100 of FIG. 1, input voltages provided to sense nodes are provided source-to-drain from respective transistors, namely transistors 242 and 247. In brief, transistors 242 and 247 are configured as respective pass gates.

In contrast to sense amp 190 of FIG. 1, sense amp 290 is precharged to Vdda 101 and not precharged to Vss 104. In further contrast to sense amp 190 of FIG. 1, sense amp 290 of FIG. 2 operates at a source voltage level of Vdda 101 and not Vdd 102 as in FIG. 1.

To avoid having a voltage difference from Vss 104 to Vdda 101 experienced by transistors 252, 253, and 299, such transistors are body biased by Vwrite voltage 131, and not body biased by Vss 104, such as with respect to transistors 152 and 153 of FIG. 1. Vwrite voltage 131 is a positive voltage which is greater than Vss and thus the voltage differential from Vwrite voltage 131 to Vdda 101 may be less than or approximately the same as the voltage differential from Vss 104 to Vdd 102.

When sense amp 290 is to be operated for sensing, psab signal 227 is not asserted and sae signal 226 is asserted. Accordingly, transistors 251, 254, and 246 are OFF, and transistor 299 is ON. Furthermore, Sampb signal 223 is asserted such that sref 133 is passed to SAb 129, and TBus 120 voltage is passed to SA 128. The same voltage levels, namely either 1.1 volts for a logic high or 1.5 volts for a logic low at SA 128 and a reference voltage of approximately 1.3 volts as SAb 129, are assumed for purposes of clarity by way of example and not limitation.

There may be applications where the voltage is to be stepped down from Vdda 101 to Vdd 102. Accordingly, transistor 257, as well as dummy transistor 258 for purposes of circuit balancing, may be relatively thick oxide devices in comparison with the other transistors of FIG. 2. Transistor 257 may thus be configured to turn ON at approximately 0.5 volts or less. Thus, Gbus 160 may be precharged, for example to Vss 104 (not shown), for reading out data from SA 128. In this embodiment, data to be sensed and data to be read out after sensing is provided and obtained, respectively, from SA 128. Thus, a thick oxide transistor 257 may be used to step down voltage from Vdda for operating using Vss and Vdd levels.

In the example embodiment of FIG. 1, approximately 1.1 volts may cause sense amp 190 to detect a logic low level, and approximately 0.7 volts may cause sense amp 190 to detect a logic high level. In the example embodiment of FIG. 2, because high threshold voltage transistor devices need not be used, voltages on TBus 120 may be approximately those on SA 128, namely approximately 1.1 volts for a logic high condition and approximately 1.5 volts for a logic low condition. Furthermore, sref voltage 133 on SAb 129 may be approximately 1.3 volts, and not an SAb 129 voltage of approximately 0.9 volts as described with respect to sense amp 190 of FIG. 1.

Figure 3:
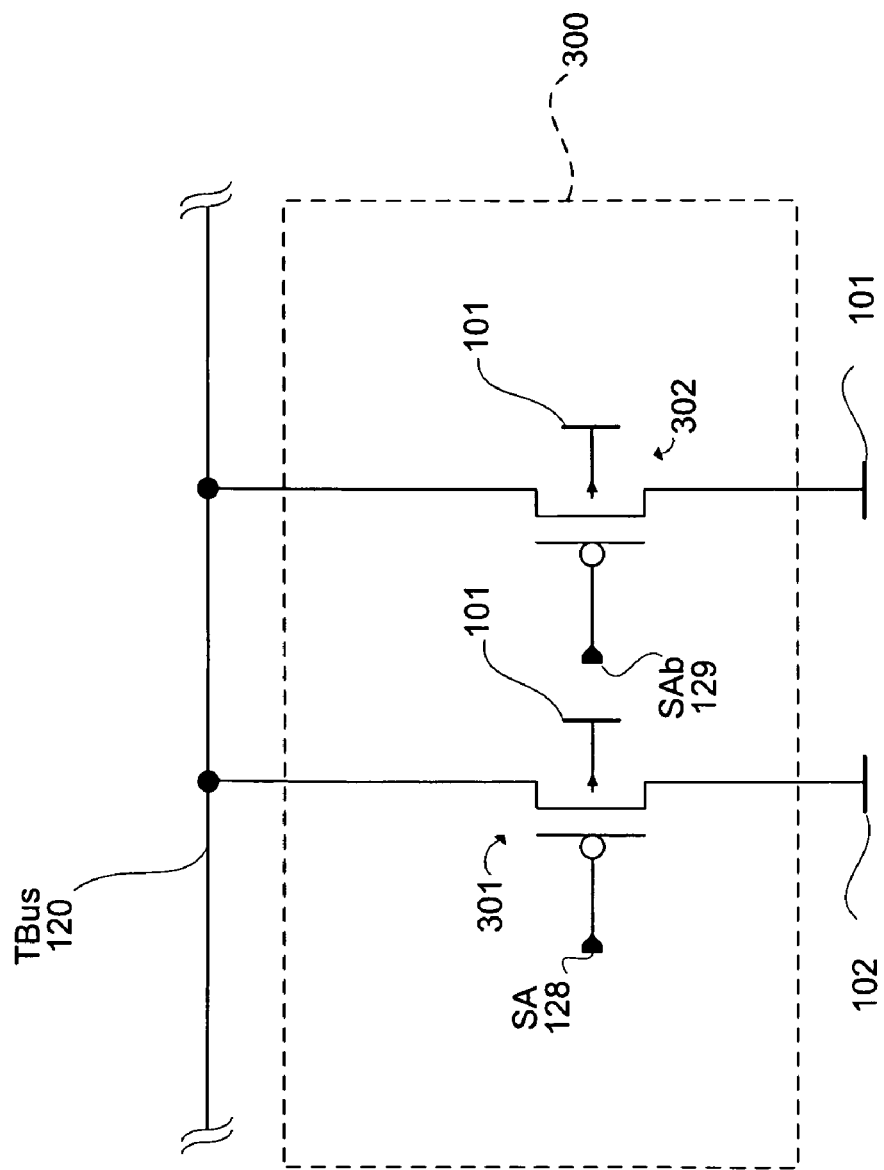
FIG. 3 is a circuit diagram depicting an exemplary embodiment of an optional sensed-level hold circuit of the sense amp device of FIG. 2.

FIG. 3 is a circuit diagram depicting an exemplary embodiment of optional sensed-level hold circuit 300 of FIG. 2. With reference to FIGS. 2 and 3, optional sensed-level hold circuit 300 is further described. Sensed-level hold circuit 300 includes p-type transistor 301 and p-type transistor 302. A source node of p-type transistor 301 is coupled to Vdd 102, and a source node of p-type transistor 302 is coupled to Vdda 101. However, each of p-type transistors 301 and 302 is body biased with Vdda 101.

A gate of p-type transistor 301 is coupled to SA 128, and a gate of p-type transistor 302 is coupled to SAb 129. Thus, after a sensing operation by sense amp 290 of FIG. 2 has completed, voltage levels on SA 128 and SAb 129 are at opposite states. Thus, one of p-type transistors 301 and 302 is ON, and the other of p-type transistors 301 and 302 is OFF.

For example, assuming SA 128 is at approximately 1.5 volts for representing a logic 0 on BL 110, then transistor 253 is turned ON coupling SAb 129 to Vwrite 131 via transistors 299 and 253 for a read operation. Accordingly, transistor 243 turns ON, and transistors 252 and 244 do not turn ON; rather both are OFF. For transistor 243 in an ON state, SA 128 is electrically coupled to Vdda 101, and hence SA 128 is pulled up to approximately 1.5 volts. P-type transistors 301 and 302 are configured to turn ON when a voltage of Vwrite 131 or less is applied to their respective gates. For SAb 129 coupled to Vwrite 131, p-type transistor 302 is in an ON state, and for SA 128 electrically coupled to Vdda 101, p-type transistor 301 is in an OFF state. Drain nodes of p-type transistors 301 and 302 are coupled to TBus 120. Thus, for p-type transistor 302 in an ON state, TBus 120 is electrically coupled to Vdda 101.

If a logic 1 were on BL 110, then SA 128 may be at approximately 1.1 volts. Hence, transistors 252 and 244 turn ON, and transistors 253 and 243 do not turn ON; rather both are OFF. Thus, SA 128 may be electrically coupled to Vwrite 131, and SAb 129 may be electrically coupled to Vdda 101. In this state, SA 128, being electrically coupled to Vwrite 131, causes p-type transistor 301 to turn ON. For p-type transistor 301 in an ON condition, TBus 120 is electrically coupled to Vdd 102.

Thus, it should be appreciated that for a logic 1 applied to SA 128, a Vdd 102 logic level may be held on TBus 120, and for a logic 0 applied to SA 128, a Vdda 101 logic level may be held on TBus 120. Holding logic levels on TBus 120 may be used to avoid having to transition such logic levels when going from one operation, such as a read operation, to another operation, as described below in additional detail, in order to conserve power. Accordingly, it should be appreciated that transitioning from one logic level to another logic level may consume more power than maintaining a logic level with respect to transitioning from one operation to a next operation where such logic level from the prior operation is to be maintained during the next operation.

Figure 4:
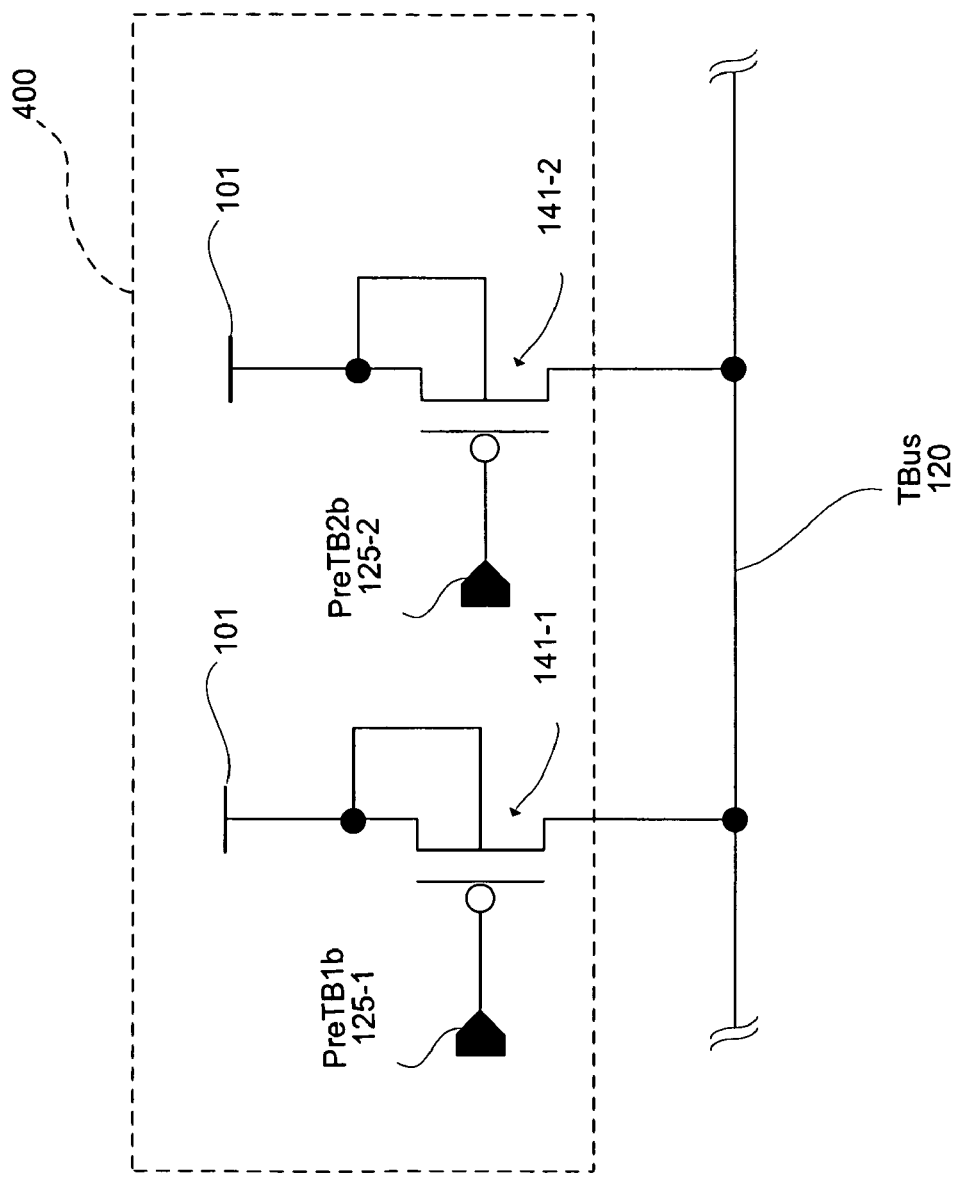
FIG. 4 is a circuit diagram depicting an exemplary embodiment of an optional precharge circuit of the sense amp device of FIG. 1.

FIG. 4 is a circuit diagram depicting an exemplary embodiment of optional precharge circuit 400 of FIG. 1. With reference to FIGS. 1 and 4, optional precharge circuit 400 is further described. Optional precharge circuit 400 includes p-type transistor 141-1 and p-type transistor 141-2. P-type transistor 141-1 may be configured differently than p-type transistor 141-2 such that the strength of pull-up voltage applied for pulling up TBus 120 to Vdda 101 when p-type transistor 141-1 is in an ON condition is substantially greater than the pull-up strength of p-type transistor 141-2 when in an ON condition. In this example, source nodes of each of p-type transistors 141-1 and 141-2 are coupled to Vdda 101, and drain nodes of each of p-type transistors 141-1 and 141-2 are coupled to TBus 120.

Different precharge TBus signals are applied to respective gates of p-type transistors 141-1 and 141-2. In this example, precharge TBus ("PreTB1b") signal 125-1 is applied to the gate of p-type transistor 141-1, and precharge TBus ("PreTB2b") signal 125-2 is applied to the gate of p-type transistor 141-2.

During a precharge operation of TBus 120, both of precharge signals 125-1 and 125-2 may be asserted for a period of time in order to more rapidly drive TBus to Vdda 101 for precharging purposes. However, as previously described for a logic 1 on BL 110, TBus 120 may be at approximately 1.1 volts. Thus, after precharging TBus 120, PreTB1b signal 125-1 may be deasserted. After deassertion of preTB1b signal 125-1, preTB2b signal 125-2 may continue to be asserted but because the relative pull-up strength of p-type transistor 141-2 is weaker than if both p-type transistors 141-1 and 141-2 were active, TBus 120 more readily transitions down to the lower voltage level associated with a logic 1 in the example.

In the above description, it was assumed that p-type transistors 141-1 and 141-2 were configured to provide relatively different pull-up strengths; however, such transistors may be generally equivalently configured where having one turned OFF may be sufficient for purposes of more readily allowing TBus 120 to transition to a lower voltage level. However, by having both pull-up transistors 141-1 and 141-20N, TBus 120 may be more rapidly pulled up to Vdda 101 for purposes of precharging TBus 120. Signaling associated with precharge signals 125-1 and 125-2 is described in additional detail below.

Figure 5:
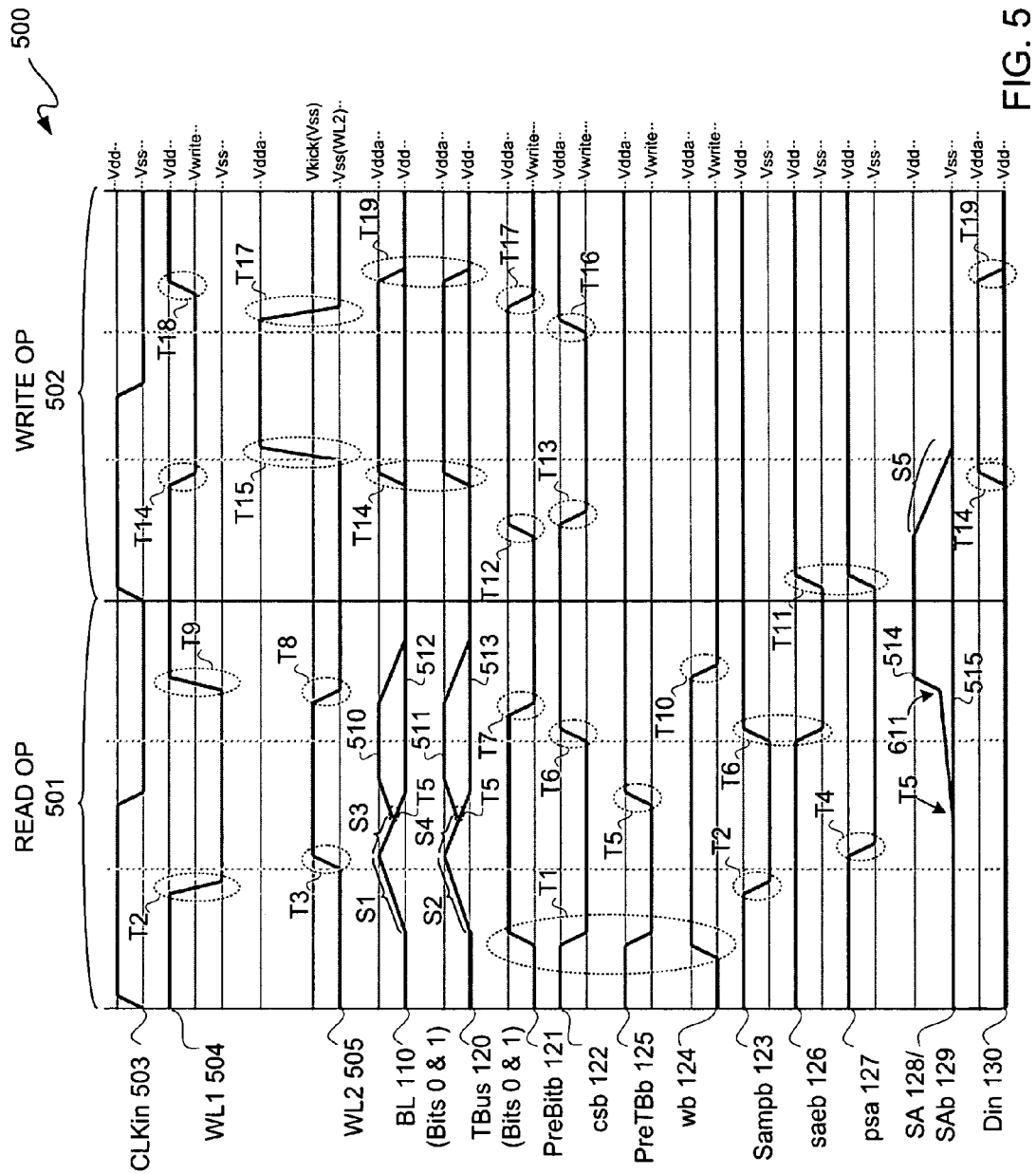
FIG. 5 is a signal diagram depicting an exemplary embodiment of signal timing, including a read operation and a write operation, for the sense amp device of FIG. 1.

FIG. 5 is a signal diagram depicting an exemplary embodiment of signal timing 500 for sense amplifier device 100 of FIG. 1. An input clock signal ("CLKin") 503 is illustratively shown having two periods. In a first period, a read operation 501 is performed followed by a write operation 502 in the second period.

As signal timing 500 is for sense amplifier device 100 of FIG. 1, FIG. 5 is further described with simultaneous reference to FIG. 1. A WL1 signal 504 is a signal on a WL1 of a memory array employing dynamic thyristor-based memory cells. Likewise, WL2 signal 505 is on a WL2 of such memory array. Voltage levels for WL1 504 are a high rail voltage of Vdd 102, a low rail voltage of Vss 104, and an intermediate voltage of Vwrite 131. High and low voltage levels for CLKin 503 are Vdd 102 and Vss 104, respectively. Voltage levels for WL2 signal 505 are a logic high voltage of Vdda 101, a logic low voltage of Vss for WL2 ("Vss(WL2)"), which lower level voltage may be approximately −0.5 volts for the example voltage previously described, and an intermediate voltage of Vkick, which may be Vss 104 for the example voltages previously described.

For a read operation 501, PreBitB signal 121 is transitioned from Vwrite 131 to Vdda 101, as is wb signal 124. Csb signal 122 and PreTBb signal 125 are transitioned from Vdda 101 to Vwrite 131. Transitions of signals 121, 122, 124, and 125 generally take place at time T1. Also generally at time T1, Sampb signal 123 may be transitioned from Vdd 102 to Vss 104; however, to allow any charge which may have accumulated at node 181 to leak-off or otherwise be dissipated, Sampb signal 123 may be asserted after time T1, as generally indicated in FIG. 5 at time T2. Also generally between time T1 and time T2 or at time T2, WL1 signal 504 may be transitioned from Vdd 102 to Vss 104. Generally at time T3 sometime after time T2, WL2 signal 505 may be transitioned from Vss(WL2) to Vkick, namely from approximately −0.5 to 0 volts in the example.

Sometime after time T3, psa signal 127 may be transitioned from Vdd 102 to Vss 104 generally at time T4. From approximately time T1 to approximately time T4, BL 110 and TBus 120 may be precharged from Vdd 102 to Vdda 101 generally during intervals S1 and S2, respectively. After psa signal 127 is asserted, capacitive couplings between adjacent bitlines to BL 110 of a memory array may cause voltage drop on BL 110 and TBus 120 as generally indicated at intervals S3 and S4, respectively. At approximately time T5, voltage on BL 110 and TBus 120 may go one of either two directions depending on whether a logic 0 or a logic 1 is stored in a dynamic thyristor-based memory cell being accessed by a read operation as associated with BL 110 and a selected column. Continuing the above example, sections 510 and 511 respectively of BL 110 and TBus 120 signals indicate logic 0 voltages and sections 512 and 513 of BL 110 and TBus 120, respectively, indicate logic 1 voltages. In the example, voltages of approximately 1.5 and 1.1 volts were illustratively used. Approximately 1.1 volts is greater than Vdd 102, which may be approximately 1.0 volts. Again, it should be appreciated that the voltages selected were merely example voltages for purposes of clarity and not limitation as previously described.

At approximately time T5, voltages of SA 128 and SAb 129 may transition in opposite directions as indicated by sections 514 and 515, respectively. Thus, either SA 128 or SAb 129 may transition to Vdd 102, and the other of SA 128 and SAb 129 may transition to Vss 104. Again, this depends on whether a logic 1 or a logic 0 is read from BL 110, as previously described. Knee 611 sometime after time T6 generally indicates when sense amp 190 is rapidly transitioning to a latched state. Furthermore, at approximately time T5, PreTBb signal 125 is transitioned from Vwrite 131 to Vdda 101. After time T5, at approximately time T6, csb signal 122 and Sampb signal 123 are transitioned from their respective logic low levels to their respective logic high levels. Furthermore, at approximately time T6, saeb signal 126 is asserted by transitioning from Vdd 102 to Vss 104 to activate sense amp 190 for sensing. Thereafter, at approximately time T7, PreBitb signal 121 may be transitioned from Vdda 101 to Vwrite 131 to precharge BL 110. After time T7, generally at time T8, WL2 signal 505 may be transitioned from Vss 104 to Vss (WL2). Later generally at time T9, WL1 signal 504 may be transitioned from Vss 104 to Vdd 102. After time T9, namely generally at time T10, wb signal 124 may be transitioned from Vdda 101 to Vwrite 131.

For a write operation 502 for such dynamic thyristor-based memory cell following a read operation 501, generally at time T11 saeb signal 126 and psa signal 127 may each be transitioned from Vss 104 to Vdd 102. Thereafter, generally at time T126, PreBitb signal 121 may be transitioned from Vwrite 131 to Vdda 101. Subsequently, csb signal 122 may be transitioned from Vdda 101 to Vwrite 131 generally at time T13. After time T13 for some interval of time, generally indicated as interval S5, charge is bled off SA 128 and SAb 129 as both of those sense nodes are pulled to Vss 104.

Generally at time T14, WL1 signal 504 may be transitioned from Vdd 102 to Vwrite 131 for a write operation. Furthermore, generally at time T14 depending on whether a logic 1 or a logic 0 is to be written as indicated by Din signal 130, BL 110, TBus 120, and Din 130 may transition from their logic low levels to their logic high levels, namely from Vdd 102 to Vdda 101, or may stay at their logic low level of Vdd 102. Generally at time T15, WL2 signal 505 may be transitioned from its logic low level, namely Vss(WL2), to Vdda 101.

Following a write to a dynamic thyristor-based memory cell associated with BL 110, csb signal 122 may be transitioned from Vwrite 131 to Vdda 101 generally at time T16. Thereafter, generally at time T17, PreBitb signal 121 may be transitioned from Vdda 101 to Vwrite 131, and WL2 signal 505 may be transitioned from Vdda 101 to Vss(WL2). Generally at time T18 following time T17, WL1 signal 504 may be transitioned from Vwrite 131 to Vdd 102. Thereafter generally at time T19, depending on whether or not a logic 1 or a logic 0 was written, BL 110 and TBus 120 may transition from Vdda 101 to Vdd 102. Again, depending on whether a logic 1 or a logic 0 was written, Din signal 130 may transition from Vdd 101 to Vdd 102 generally at time T19.

Figure 6:
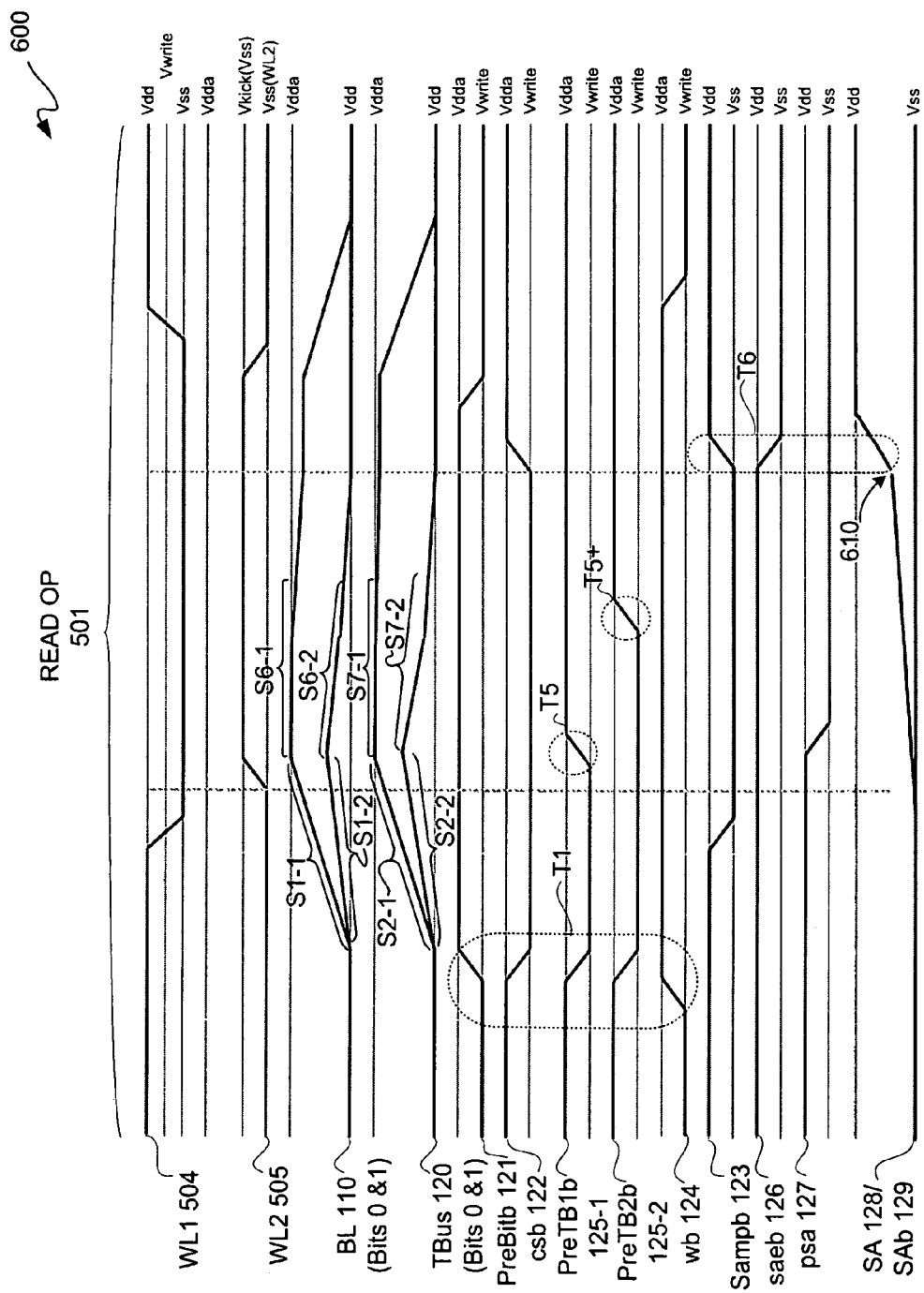
FIG. 6 is a signal diagram depicting an alternate exemplary embodiment of the signal timing of the read operation of FIG. 5.

FIG. 6 is a signal diagram depicting an alternate exemplary embodiment of the signal timing of read operation 501 of FIG. 5, namely signal timing 600. However, for signal timing 600, rather than a single PreTBb signal 125 as in FIG. 5, two PreTBb signals, namely PreTB1b 125-1 and PreTB2b signal 125-2, previously described with reference to FIG. 4, are used. As much of the description between read operation 501 of FIG. 6 and read operation 501 of FIG. 5 is the same, repetition of such same description is avoided for purposes of clarity.

Generally at time T1, both of PreTB1b signal 125-1 and PreTB2b signal 125-2 are asserted, transition from Vdda 101 to Vwrite 131, to cause precharging of TBus 120 toward Vdda 101. However, this precharging of TBus 120 may have different ramp rates and voltage apexes depending on whether a logic 1 or a logic 0 is stored in the dynamic thyristor-based memory cell being accessed as associated with BL 110. For a logic 0, ramp intervals S1-1 and S2-1 respectively associated with BL 110 and TBus 120 indicate that precharging brings those lines to at or approximately a Vdda 101 level or apex. However, for a logic 1 stored in such memory cell associated with BL 110, ramp intervals S1-2 and S2-2 respectively associated with BL 110 and TBus 120 indicate that voltage of those lines may ramp to a voltage between Vdd 102 and Vdda 101 due to precharging, which voltage apex or level is substantially lower than Vdda 101. This voltage on TBus 120 may be set by a resistive or voltage divider (not shown) set up between the dynamic thyristor-based memory cell being accessed ("bit cell") and the two Vdda 101 voltage pull-ups, namely via transistors 141-1 and 141-2.

Generally at time T5, PreTB1b signal 125-1 is deasserted, while PreTB2b signal 125-2 continues to be asserted until time T5+. During the interval from time T5 to T5+, coupling TBus 120 for example to Vdda 101 via p-type transistor 141-2 of FIG. 4 is sufficient to maintain a logic 0 generally at least approximately at Vdda 101 for intervals S6-1 and S7-1 of BL 110 and TBus 120, respectively; however, turning OFF p-type transistor 141-1 allows a logic 1 to more rapidly descend toward Vdd 102 during intervals S6-2 and S7-2 respectively of BL 110 and TBus 120. This voltage on TBus 120 is still set by the resistive divider; however, now such resistive divider is between the bit cell and the two Vdda 101 voltage pull-ups, namely via transistors 141-1 and 141-2.

By more rapidly allowing a voltage to go to its rail voltage, SA 128 and SAb 129 may more rapidly go to their associated rail voltages, and thus sense amp device 100, as well as sense amp device 200, may operate with more signal margin, as well as faster, than if only a single PreTBb pull-up is used. This increase in speed is generally indicated by knee 610 generally occurring at or before time T6, where knee 611 of FIG. 5 occurs after time T6.

Even though the description of FIG. 6 is for a read operation associated with sense amp device 100 of FIG. 1, it should be appreciated that there is not a great deal of difference between read operations of sense amplifier device 100 of FIG. 1 and sense amp device 200 of FIG. 2, and consequently as indicated in FIG. 2, optional precharge circuit 400 may be used with sense amp device 200 resulting in same or similar performance enhancement.

Figure 7:
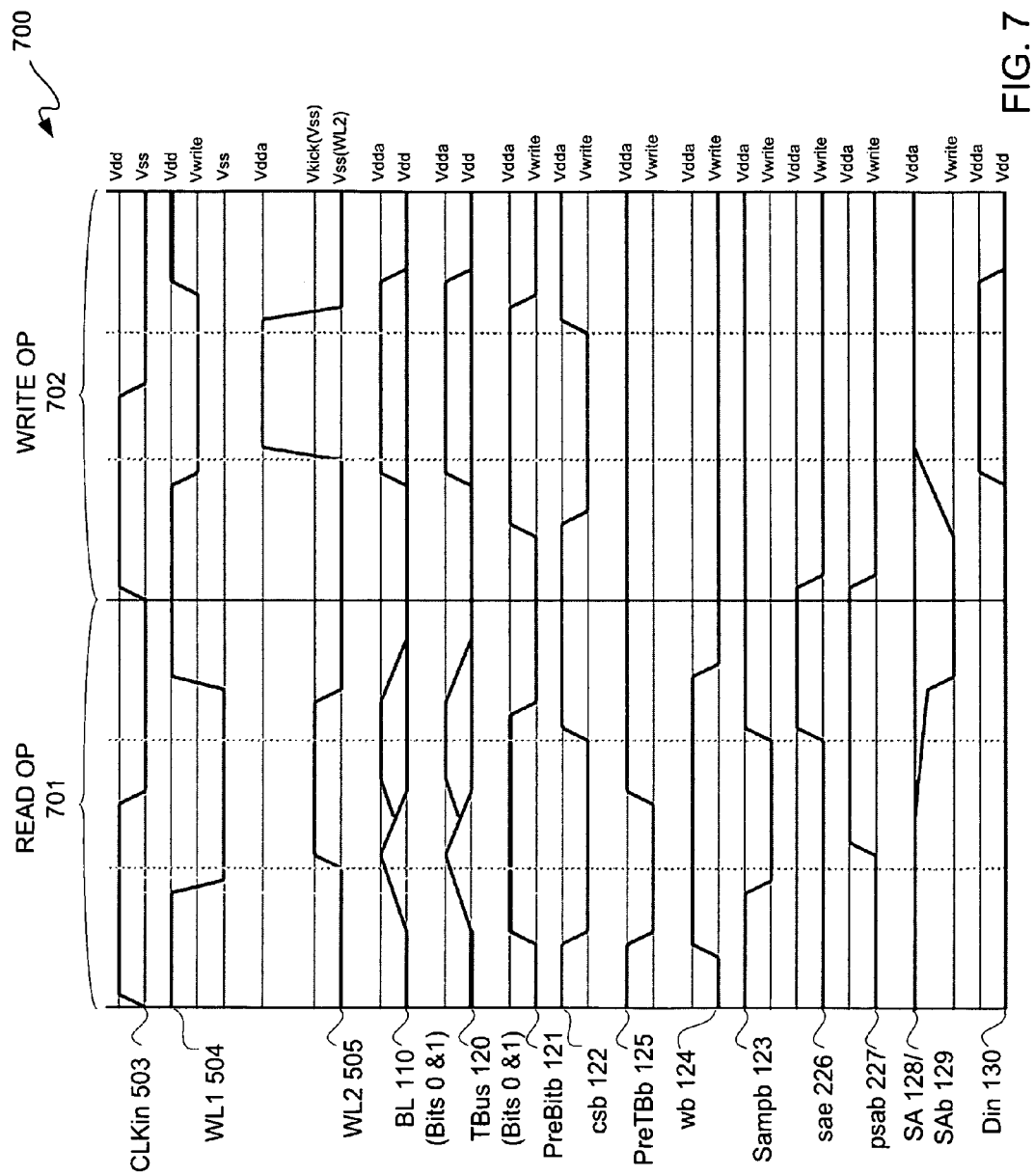
FIG. 7 is a signal diagram depicting an exemplary embodiment of signal timing for the sense amp device of FIG. 2.

FIG. 7 is a signal diagram depicting an exemplary embodiment of signal timing 700 for sense amp device 200 of FIG. 2. Accordingly, signal timing 700 of FIG. 7 is described with simultaneous reference to FIG. 2.

WL1 signal 504 and WL2 signal 505 are the same in FIGS. 5 and 7. Furthermore, BL 110, TBus 120, and Din signal 130 are the same in FIGS. 5 and 7. Additionally, PreBitb signal 121, csb signal 122, PreTBb signal 125 and wb signal 124 are the same in FIGS. 5 and 7. Accordingly, repeated description of such signals is avoided for purposes of clarity.

Sampb signal 123 in FIGS. 5 and 7 is generally the same, except Sampb signal 123 of FIG. 7 has voltage levels of Vwrite 131 and Vdda 101 rather than Vss 104 and Vdd 102 as in FIG. 5, otherwise these are the same signals. Sae signal 226, psab signal 227, SA 128, and SAb 129 all transition between Vdda 101 and Vwrite 131 in FIG. 7, and those corresponding signals in FIG. 5, namely saeb signal 126, psa signal 127, SA 128, and SAb 129, respectively, all transition between Vdd 102 and Vss 104. Furthermore, such set of signals 226, 227, 128, and 129 of FIG. 7 are inverted in comparison to their counterpart set of signals 126, 127, 128, and 129 in FIG. 5. Otherwise, these are the same signals, and repeated description is avoided for purposes of clarity.

Figure 8:
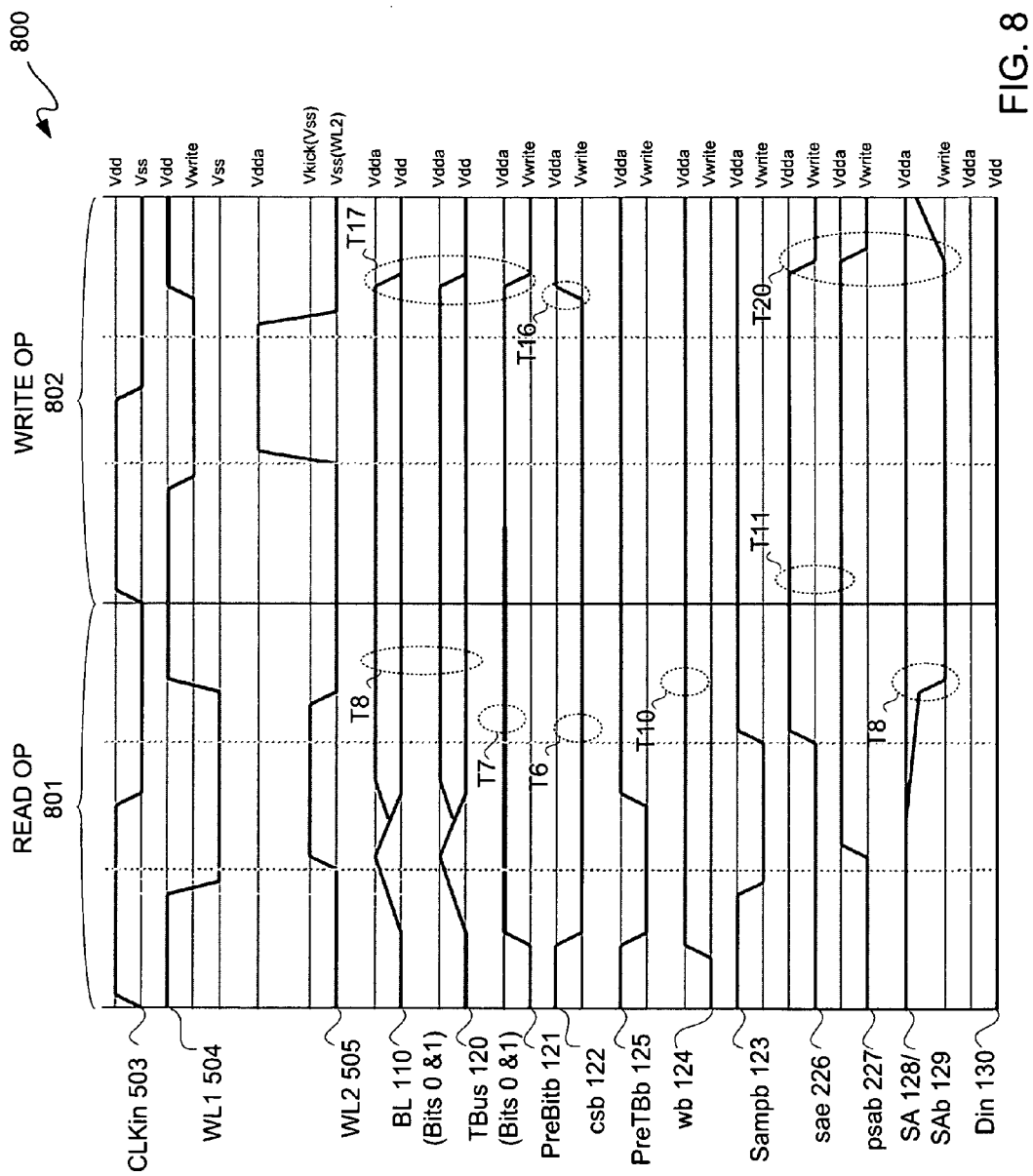
FIG. 8 is a signal diagram depicting an exemplary embodiment of signal timing when the sensed-level hold circuit of FIG. 3 is optionally used as part of the sense amp device of FIG. 2.

FIG. 8 is a signal diagram depicting an exemplary embodiment of signal timing 800 when sensed-level hold circuit 300 of FIG. 3 is optionally used as part of sense amplifier device 200 of FIG. 2. Accordingly, signal timing 800 of FIG. 8 is described with simultaneous reference to FIGS. 2 and 3.

It should be appreciated that for a write operation 802 following a read operation 801, voltages on BL 110 and TBus 120 for the write operation may be held at their respective levels from read operation 801. Following write operation 802, another read operation, such as read operation 701 of FIG. 7, may be used.

Generally from time T6, csb signal 122 may be held at Vwrite 131 generally until time T16. Generally from time T7, PreBitb signal 121 may be held at Vdda 101 until approximately time T17. Furthermore, by feeding back voltages of SA 128 and SAb 129 to p-type transistors 301 and 302, respectively, generally from time T8, voltages whether for a logic high or a logic low are held on BL 110 and TBus 120. These same voltage levels on BL 110 and TBus 120 may be relatively static until approximately time T17. Wb signal 124 is held at Vdda 101 through write operation 802 starting from about time T10. Additionally, sae signal 226 and psab signal 227 may be held at Vdda 101 generally starting from about time T11 until about time T20. Holding sae signal 226 active causes sense amp 290 to hold voltages at sense nodes, namely SA 128 and SAb 129, at Vdda 101 and Vwrite 131, or vice versa, generally until time T20. Starting at approximately time T20 and thereafter, voltage may rise on each such sense node responsive to each of SA 128 and SAb 129 being pulled to Vdda 101. In this example, it is illustratively shown that Din signal 130 is held at a logic low level of Vdd 102.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A sense amplifier, comprising:
    a first supply node having associated therewith a first supply voltage level;
    a second supply node having associated therewith a second supply voltage level;
    the first supply voltage level being greater than the second supply voltage level;
    a ground node having associated therewith a ground voltage level;
    cross-coupled inverters having a first sense node and a second sense node;
    the cross-coupled inverters operatively coupled between the ground node and the second supply node for sensing voltage;

a first sampling transistor and a first supply transistor coupled in series for pass gating between the first supply voltage level and the first sense node;
a second sampling transistor and a second supply transistor coupled in series for pass gating between the first supply voltage level and the second sense node;
each of the first sampling transistor and the second sampling transistor gated by a sample signal;
the first supply transistor having a transfer bus coupled to a gate thereof;
the second supply transistor being gated by a sense reference voltage;
the sense reference voltage being between the first supply voltage level and the second supply voltage level;
each of the first supply transistor and the second supply transistor back body biased with a write voltage; and
the write voltage having a write voltage level being between the second supply voltage level and the ground voltage level.

2. The sense amplifier according to claim 1, wherein the first sampling transistor and the second sampling transistor are back body biased with the second supply voltage level.

3. The sense amplifier according to claim 1, wherein the transfer bus is coupled in series with a bitline of an array of dynamic thyristor-based memory cells.

4. The sense amplifier according to claim 1, wherein:
the first sense node and the second sense node are coupled to the ground node via a first pull-down transistor and a second pull-down transistor, respectively;
the first pull-down transistor and the second pull-down transistor are each gated with a pull-down signal;
the cross-coupled inverters are coupled to the second supply node via a pull-up transistor;
the pull-up transistor is coupled in series with the second supply node and p-type transistors of the cross-coupled inverters;
the pull-up transistor is gated with a sensing activation signal;
a select transistor pass gates the coupling of the transfer bus and the bitline;
the select transistor is gated with a column select signal;
the column select signal and the bitline are associated with an array of memory cells;
a data input transistor is coupled between the transfer bus and a data input port; and
the data input transistor is gated with a write signal.

5. The sense amplifier according to claim 1, further comprising:
a pre-charge circuit including a first pre-charge transistor and a second pre-charge transistor coupled in parallel between the first supply node and the transfer bus;
the first pre-charge transistor gated with a first pre-charge transfer bus signal;
the second pre-charge transistor gated with a second pre-charge transfer bus signal; and
the first pre-charge transistor configured differently than the second pre-charge transistor;
wherein pull-up voltage strength for pulling up voltage on the transfer bus toward the first supply voltage level is substantially greater via the first pre-charge transistor than via the second pre-charge transistor.

6. A method for voltage sensing, comprising:
providing a first supply voltage level;
providing a second supply voltage level;
the first supply voltage level being greater than the second supply voltage level;
providing a ground voltage level;
operating cross-coupled inverters between the second supply voltage level and the ground voltage level for the voltage sensing;
first pass gating the first supply voltage level to an input sense node of the cross-coupled inverters
second pass gating the first supply voltage level to an output sense node of the cross-coupled inverters;
the first pass gating and the second pass gating each including asserting a sampling signal for electrical coupling of the first supply voltage level to the input sense node and to the output sense node, respectively;
the first pass gating further including:
passing voltage to be sensed on a bus to a first gate for the electrical coupling of the first supply voltage level to the input sense node;
applying a write voltage for first back body biasing associated with the first gate; and
the write voltage having a write voltage level being between the second supply voltage level and the ground voltage level; and
the second pass gating further including:
applying a sense reference voltage to a second gate for the electrical coupling of the first supply voltage level to the output sense node;
the sense reference voltage having a sense voltage level between the first supply voltage level and the second supply voltage level; and
applying the write voltage for second back body biasing associated with the second gate;
wherein a first voltage drop from the bus to the input sense node and a second voltage drop from the sense reference voltage to the output sense node are sufficient for the voltage sensing with the cross-coupled inverters operating within a source voltage domain associated with the second voltage level.

7. The method according to claim 6, further comprising:
the cross-coupled inverters being part of a sense amplifier having thin gate dielectric transistors;
limiting voltage swing of the sense amplifier to no more than a first voltage difference between the second supply voltage level and the ground voltage level; and
a second voltage difference between the first supply voltage level and the write voltage level being at least approximately equivalent to the first voltage difference.

8. The method according to claim 6, further comprising:
limiting duration of first interim nodal voltage associated with the first pass gating as being above the second supply voltage level; and
maintaining a second interim nodal voltage associated the second pass gating below the second supply voltage level.

9. The method according to claim 6, wherein the voltage sensing is for a read operation of a dynamic thyristor-based memory cell.

10. A sense amplifier, comprising:
a first supply node having associated therewith a first supply voltage level;
a second supply node having associated therewith a second supply voltage level;
the first supply voltage level being greater than the second supply voltage level;
a ground node having associated therewith a ground voltage level;
cross-coupled inverters having a first sense node and a second sense node;
a first sampling transistor and a first pull-up transistor coupled to the first sense node;

a second sampling transistor and a second pull-up transistor coupled to the second sense node;
the first sampling transistor coupled for pass gating between a transfer bus and the first sense node;
the second sampling transistor coupled for pass gating a sense reference voltage to the second sense node;
each of the first sampling transistor and the second sampling transistor gated by a sample signal;
the first pull-up transistor and the second pull-up transistor coupled for pass gating the first supply voltage level to the first sense node and the second sense node, respectively;
each of the first pull-up transistor and the second pull-up transistor gated by a pull-up signal;
the cross-coupled inverters operatively coupled between the first supply node and a write voltage for sensing voltage;
an inverter having an input node and an output node;
the input node of the inverter coupled for receiving a sensing activation signal;
the output node of the inverter coupled to a low bias node of the cross-coupled inverters;
the inverter biased between the first supply voltage level and a write voltage level for selectively electrically coupling one of the first supply voltage level and the write voltage level at a time to the low bias node responsive to the sensing activation signal;
the sense reference voltage having a sense voltage level between the first supply voltage level and the second supply voltage level; and
the write voltage level being between the second supply voltage level and the ground voltage level.

11. The sense amplifier according to claim 10, wherein:
n-type transistors of the cross-coupled inverters are each back body biased with the write voltage level; and
the first sampling transistor and the second sampling transistor are each back body biased with the first supply voltage level.

12. The sense amplifier according to claim 10, further comprising:
an access transistor sourced biased with the second supply voltage level and back body biased with the first supply voltage level;
the access transistor having a drain coupled to an output bus; and
the access transistor having a gate coupled to the first sense node;
wherein the first sense node is for both input and output of the sense amplifier.

13. The sense amplifier according to claim 12, wherein:
the access transistor has a substantially thicker gate oxide than transistors of the cross-coupled inverters; and
the access transistor is configured to transition to a substantially conductive state at approximately 0.5 volts or less for precharging the output bus to the ground voltage level;
wherein operating voltage is stepped down from the first supply voltage level for operational output via the output bus using the second supply voltage level and the ground voltage level.

14. The sense amplifier according to claim 13, wherein voltages on the transfer bus are approximately those on the first sense node during a sensing operation.

15. The sense amplifier according to claim 10, further comprising:
a sensed-level hold circuit coupled to the transfer bus;
the sensed-level hold circuit including:
a first hold transistor coupled between the transfer bus and the second supply node having a gate coupled to the first sense node; and
a second hold transistor coupled between the transfer bus and the first supply node having a gate coupled to the second sense node.

16. The sense amplifier according to claim 15, wherein each of the first hold transistor and the second hold transistor are back body biased with the first supply voltage level.

17. A method for voltage sensing, comprising:
providing a first supply voltage level;
providing a second supply voltage level;
the first supply voltage level being greater than the second supply voltage level;
providing a ground voltage level;
operating cross-coupled inverters between the first supply voltage level and a write voltage level for the voltage sensing;
the write voltage level being between the second supply voltage level and the ground voltage level;
pass gating with a first sampling transistor between a transfer bus and a first sense node of the cross-coupled inverters;
pass gating with a second sampling transistor a sense reference voltage to a second sense node of the cross-coupled inverters;
the sense reference voltage having a sense voltage level between the first supply voltage level and the second supply voltage level;
gating a first sampling transistor and a second sampling transistor with a sample signal;
pass gating the first supply voltage level to the first sense node and the second sense node respectively with a first pull-up transistor and a second pull-up transistor;
gating each of the first pull-up transistor and the second pull-up transistor with a pull-up signal;
inverting a sensing activation signal for activating and deactivating the cross-coupled inverters for the voltage sensing; and
the activating and the deactivating including selectively electrically coupling the write voltage level and the first supply voltage level, respectively, to a low bias node of the cross-coupled inverters responsive to the sensing activation signal.

18. The method according to claim 17, further comprising:
the cross-coupled inverters being part of a sense amplifier having thin gate dielectric transistors; and
limiting voltage swing of the sense amplifier to no more than a voltage difference between the first supply voltage level and the write voltage level.

19. The method according to claim 17, wherein the voltage sensing is for a read operation of a dynamic thyristor-based memory cell.

20. The method according to claim 19, further comprising:
electrically coupling either the first supply voltage level or the second supply voltage level to the transfer bus responsive to a voltage sensed for the voltage sensing for the read operation; and
holding the transfer bus at either the first supply voltage level or the second supply voltage level for a subsequent operation with respect to the read operation.

* * * * *